(12) United States Patent
Kim

(10) Patent No.: US 10,411,686 B2
(45) Date of Patent: Sep. 10, 2019

(54) DELAY CELL AND CIRCUIT INCLUDING THE SAME

(71) Applicant: SK hynix Inc., Gyeonggi-do (KR)

(72) Inventor: Jae-Heung Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/847,539

(22) Filed: Dec. 19, 2017

(65) Prior Publication Data

US 2019/0007035 A1 Jan. 3, 2019

Related U.S. Application Data

(60) Provisional application No. 62/526,705, filed on Jun. 29, 2017.

(51) Int. Cl.
*H03K 5/159* (2006.01)
*H03K 5/133* (2014.01)

(52) U.S. Cl.
CPC ............ *H03K 5/159* (2013.01); *H03K 5/133* (2013.01)

(58) Field of Classification Search
None
See application file for complete search history.

(56) References Cited

U.S. PATENT DOCUMENTS

| | | | |
|---|---|---|---|
| 9,225,319 B2 | 12/2015 | Me et al. | |
| 9,966,956 B2 * | 5/2018 | Lim | H03K 19/018521 |
| 2004/0053429 A1 * | 3/2004 | Muranaka | G05B 19/128 438/17 |
| 2005/0017781 A1 * | 1/2005 | Honda | H03K 5/151 327/295 |
| 2006/0132212 A1 * | 6/2006 | Shimazawa | H03K 5/133 327/277 |
| 2008/0265944 A1 * | 10/2008 | Muraoka | H03K 19/018521 326/86 |
| 2017/0272076 A1 * | 9/2017 | Lim | H03K 19/018521 |

FOREIGN PATENT DOCUMENTS

KR 101415702 7/2014

* cited by examiner

*Primary Examiner* — Cassandra F Cox
(74) *Attorney, Agent, or Firm* — IP & T Group LLP

(57) ABSTRACT

A delay cell may include: a first inverter coupled to an input terminal; a second inverter coupled between the first inverter and an output terminal; an additional inverter coupled in parallel to the first inverter; and a delay element suitable for selectively coupling the additional inverter to the input terminal under control of a control signal.

9 Claims, 4 Drawing Sheets

DELAY CELL AND CIRCUIT INCLUDING THE SAME

CROSS-REFERENCE TO RELATED APPLICATIONS

This application claims priority to U.S. Provisional Patent Application No. 62/526,705 entitled, "DELAY CELL CONTROLLED BY THE SEQUENTIAL TURN-ON SCHEME", flied on Jun. 29, 2017, which is incorporated herein by reference in its entirety.

BACKGROUND

1. Field

Exemplary embodiments of the present invention relate to a delay cell and circuit including the same.

2. Description of the Related Art

Electronic devices such as computers, mobile phones, and storage devices may include integrated circuits (ICs) having various elements or circuits integrated therein. Each of the ICs may be coupled to one or more external circuits or devices, and include components for interfacing the external circuits or devices. For example, a peripheral device such as a memory device may be coupled to a memory controller. In general, the memory device and the memory controller may have a difference in operation speed therebetween. Therefore, the IC may need to include a delay circuit such as a delay locked loop (DLL) circuit or a phase locked loop (PLL) circuit for adjusting signal timing between the memory device and the memory controller.

SUMMARY

Various embodiments are directed to a delay circuit capable of supporting various delay values.

In an embodiment, a delay cell may include: a first inverter coupled to an input terminal; a second inverter coupled between the first inverter and an output terminal; an additional inverter coupled in parallel to the first inverter; and a delay element suitable for selectively coupling the additional inverter to the input terminal under control of a control signal.

In an embodiment, a delay circuit may include; at least one delay cell suitable for delaying an input signal applied to an input terminal, and outputting the delayed input signal as an output signal through an output terminal; and a signal generation circuit suitable for generating a control signal for controlling the delay of the input signal. The delay cell may include: a first inverter coupled to the input terminal; a second inverter coupled between the first inverter and the output terminal; an additional inverter coupled in parallel to the first inverter; and a delay element suitable for selectively coupling the additional inverter to the input terminal under control of the control signal.

In an embodiment, a delay circuit may include: at least one delay cell suitable for delaying an input signal applied to an input terminal, and outputting the delayed input signal as an output signal through an output terminal; and a signal generation circuit suitable for generating a control signal for controlling the delay of the input signal. The delay cell may include: a first inverter coupled to the input terminal; a second inverter coupled between the first inverter and the output terminal; a plurality of additional inverters coupled in parallel to the first inverter; and a delay element suitable for selectively coupling one or more of the additional inverters to the input terminal under control of a control signal.

DETAILED DESCRIPTION

Figure 1:
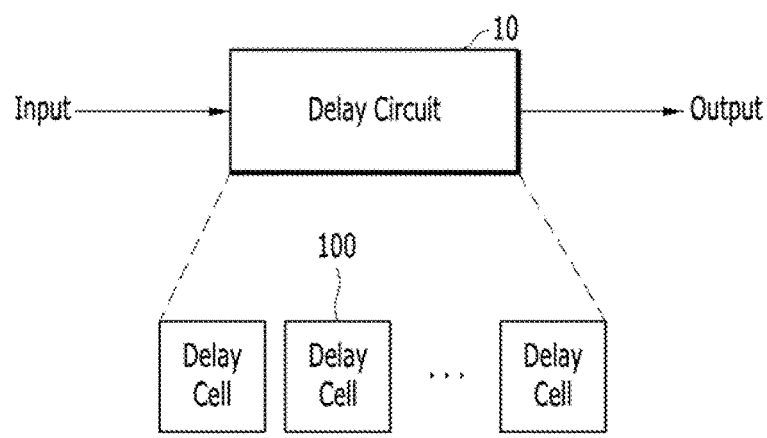
FIG. 1 is a diagram illustrating a delay circuit including one or more delay cells.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, the various embodiments of the present invention will be described in detail with reference to the attached drawings.

FIG. 1 is a diagram illustrating a delay circuit 10 including one or more delay cells. The delay circuit 10 may be used to synchronize signals that are transmitted and received between two devices for supporting two different transmission speeds, for example, between a memory device and a memory controller.

Referring to FIG. 1, the delay circuit 10 may delay an input signal and output an output signal. For this operation, the delay circuit 10 may include a plurality of delay cells 100.

Figure 2:
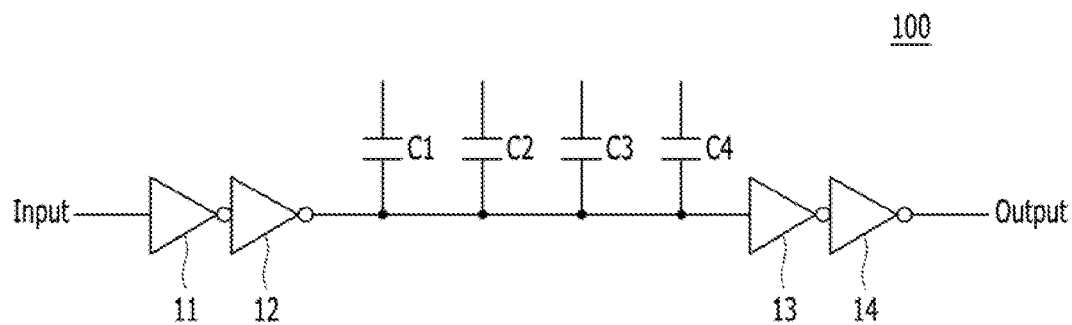
FIG. 2 is a circuit diagram illustrating a configuration of a conventional delay cell.

FIG. 2 is a circuit diagram illustrating a configuration of a conventional delay cell 100.

Referring to FIG. 2, the delay cell 100 may include a plurality of inverters 11 to 14. The number of inverters included in the delay cell 100 may be limited depending on the area, skew, and power of a delay circuit including the delay cell 100.

The delay cell 100 may include capacitors C1 to C4 for controlling a delay value thereof. The capacitors C1 to C4 may be coupled to specific nodes of the plurality of inverters 11 to 14, for example, nodes between the inverters 12 and 13. That is, the capacitors C1 to C4 may concentrate between the inverters 12 and 13. FIG. 2 illustrates that all of the capacitors C1 to C4 are coupled. However, depending on a required delay value, all or part of the capacitors C1 to C4 may be coupled.

Figure 3:
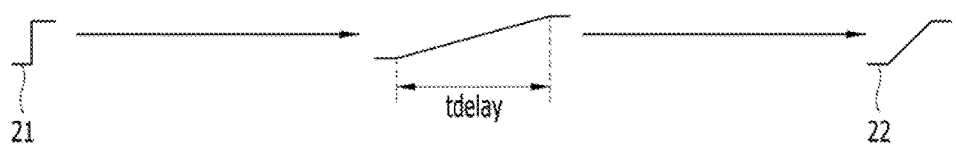
FIG. 3 is a diagram illustrating operation timing between an input signal and an output signal in the conventional delay cell of FIG. 2.

FIG. 3 is a diagram illustrating operation timing between an input signal 21 and an output signal 22 in the delay cell 100 of FIG. 2.

Referring to FIG. 3, the delay cell 100 of FIG. 2 may delay the input signal 21 by a specific time tdelay, and output the output signal 22. At this time, the delay cell 100 may control the delay with a predetermined slope using the capacitors C1 to C4 coupled to the specific nodes of the plurality of inverters 11 to 14. Therefore, although the output signal 22 obtained by delaying the input signal 21 by the specific time tdelay is outputted, the output signal 22 may have a slope loss. In order to compensate for such a slope loss of the output signal 22, additional inverters need to be used. However, the use of additional inverters may serve as a factor to increase Process-Voltage-Temperature (PVT) variations.

Figure 4:
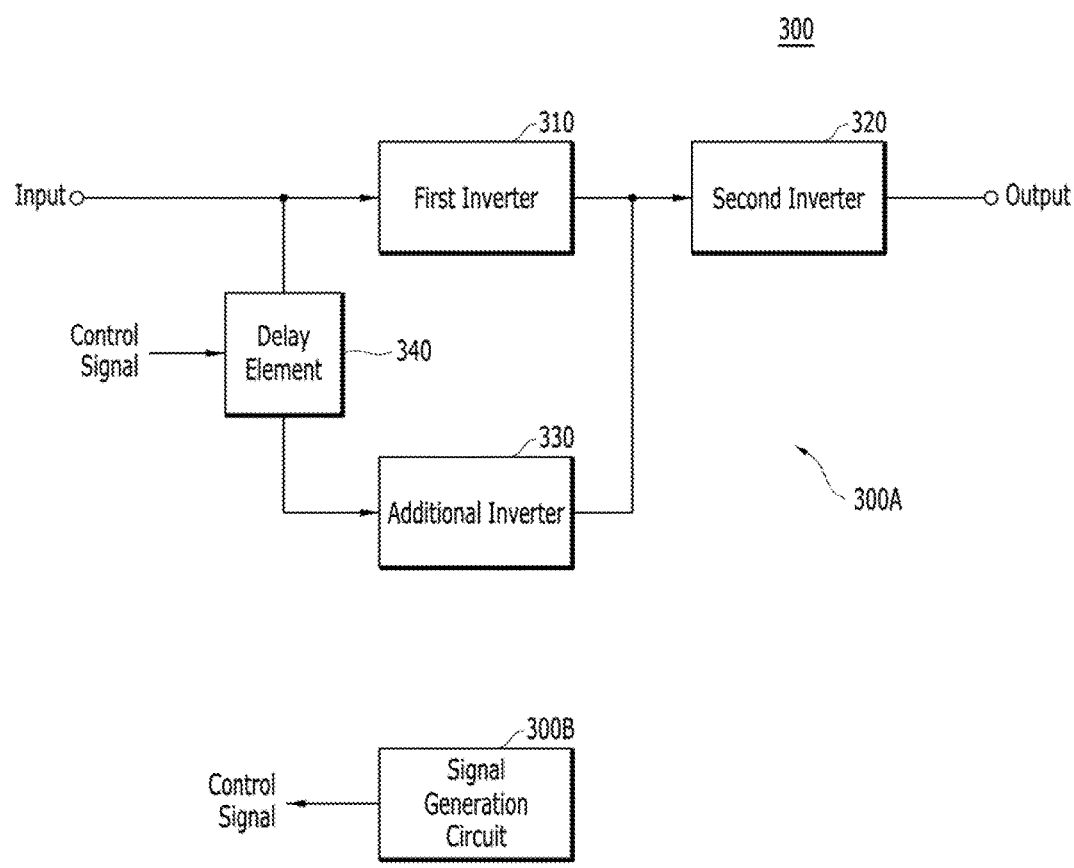
FIG. 4 is a block diagram illustrating a configuration of a delay circuit in accordance with an embodiment of the present disclosure.

FIG. 4 is a block diagram illustrating a configuration of a delay circuit 300 in accordance with an embodiment of the present disclosure.

Referring to FIG. 4, the delay circuit 300 may include a delay cell 300A. The delay cell 300A may delay an input signal applied to an input terminal Input, and output the delayed input signal as an output signal through an output terminal Output. The delay circuit 300 may further include a signal generation circuit 300B. The signal generation circuit 300B may generate a control signal for controlling the delay of the input signal in the delay cell 300A, and provide the generated control signal to the delay cell 300A.

The delay cell 300A may include a first inverter 310, a second inverter 320, an additional inverter 330, and a delay element 340. The first inverter 310 may be coupled to the input terminal Input, and receive the input signal applied through the input terminal Input. The first inverter 310 may invert the received input signal and output the inverted input signal, thereby outputting the delayed input signal. The additional inverter 330 may be coupled in parallel to the first inverter 310.

The delay element 340 may receive the control signal generated by the signal generation circuit 300B, and selectively couple the additional inverter 330 to the input terminal Input in response to the received control signal. In various embodiments, the delay element 340 may include a switching element, which is switched on in response to the control signal and couples the additional inverter 330 to the input terminal Input. For example, the delay element 340 may include a transfer gate or transfer transistor, which is turned on in response to the control signal and couples the additional inverter 330 to the input terminal Input.

When the additional inverter 330 is coupled in parallel to the first inverter 310 by the delay element 340, the additional inverter 330 may be coupled to the input terminal Input through the delay element 340, and receive an input signal applied through the input terminal Input and the delay element 340. The additional inverter 330 may invert the received signal and output the inverted signal, thereby outputting the delayed signal.

The second inverter 320 may be coupled between the first inverter 310 and the output terminal Output. The second inverter 320 may invert the signal outputted from the first inverter 310 and output the inverted signal through the output terminal Output, thereby outputting the delayed signal as the output signal. Furthermore, when the additional inverter 330 is coupled in parallel to the first inverter 310, the second inverter 320 may invert the signal outputted from the additional inverter 330 and output the inverted signal through the output terminal Output, thereby outputting the delayed signal as the output signal.

Figure 5:
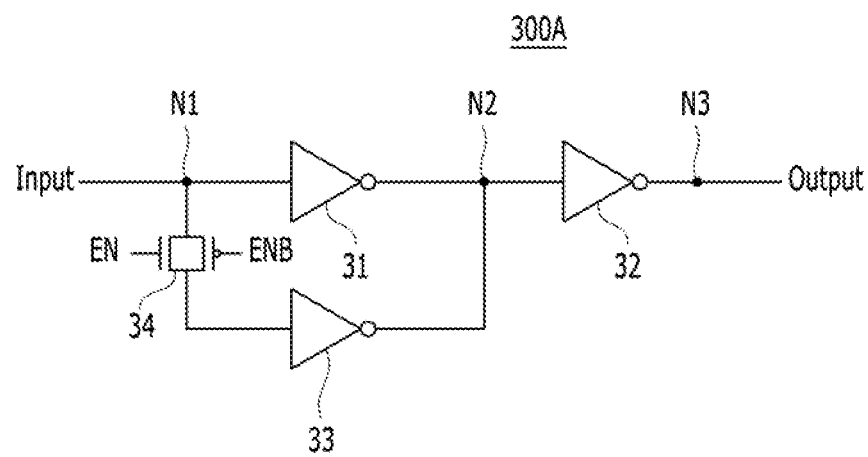
FIG. 5 is a circuit diagram illustrating a configuration of a delay cell in accordance with an embodiment of the present disclosure.

FIG. 5 is a circuit diagram illustrating a configuration of a delay cell 300A in accordance with an embodiment of the present disclosure.

Referring to FIG. 5, the delay cell 300A may delay an input signal applied to an input terminal Input, and output the delayed input signal as an output signal through an output terminal Output. The delay cell 300A may receive an enable signal EN/ENB as the control signal generated by the signal generation circuit 300B of FIG. 4.

The delay cell 300A may include a first inverter 31, a second inverter 32, an additional inverter 33, and a transfer gate 34. The first inverter 31 may be coupled to the input terminal Input through a node N1, and receive the input signal applied through the input terminal Input. The first inverter 31 may delay the received input signal and output the delayed input signal to a node N2, thereby outputting the delayed signal. The additional inverter 33 may be coupled in parallel to the first inverter 31 through the transfer gate 34.

The transfer gate 34 may receive the enable signal EN/ENB generated by the signal generation circuit 300B, and selectively couple the additional inverter 33 to the input terminal Input in response to the received enable signal. For example, the transfer gate 34 may be turned on in response to the enable signal EN/ENB, and couple the additional inverter 33 to the input terminal Input.

When the additional inverter 33 is coupled in parallel to the first inverter 31 by the transfer gate 34, the additional inverter 33 may be coupled to the input terminal Input through the transfer gate 34 and the node N1. In this case, the additional inverter 33 may receive an input signal applied through the input terminal Input, the node N1, and the transfer gate 34. The additional inverter 33 may invert the received signal and output the inverted signal to the node N2, thereby outputting the delayed signal.

The second inverter 32 may be coupled between the first inverter 31 and the output terminal Output. The second inverter 32 may invert the signal, which is outputted from the first inverter 31 and applied to the node N2 and output the inverted signal through a node N3 and the output terminal Output, thereby outputting the delayed signal. Furthermore, when the additional inverter 33 is coupled in parallel to the first inverter 31, the second inverter 32 may invert the signal, which is outputted from the additional inverter 33 and applied to the node N2 and output the inverted signal through the node N3 and the output terminal Output, thereby outputting the delayed signal.

Figure 6:
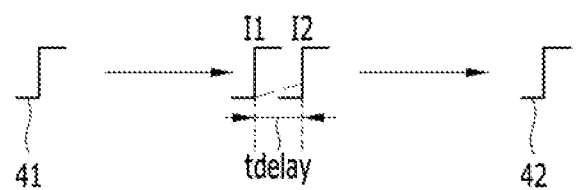
FIG. 6 is a diagram illustrating operation timing between an input signal and an output signal in the delay cell of FIG. 5.

FIG. 6 is a diagram illustrating operation timing between the input signal 41 and the output signal 42 in the delay cell 300A of FIG. 5.

Referring to FIG. 6, the delay cell 300A of FIG. 5 may delay the input signal 41 by a specific time tdelay, and output the delayed input signal as the output signal 42. At this time, the delay cell 300A may output a signal which is inverted by the inverter 31 and then inverted by the inverter 32, or output a signal which is inverted by the inverter 33 and then inverted by the inverter 32. The signal, which is inverted by the inverter 33 and then inverted by the inverter 32, may be delayed by the specific time tdelay from the signal, which is inverted by the inverter 31 and then inverted by the inverter 32. That is, the signal 12 inverted and outputted by the inverter 33 may be delayed by the specific time tdelay from the signal 11 inverted and outputted by the inverter 31. The delay cell 300A may control the inverter 31 to perform the signal inversion and output operation, and then control the inverter 33 to perform the signal inversion and output operation. As such, the delay cell 300A may control the inverters 31 and 32 to sequentially perform the operations depending on a required delay value. That is, the delay cell 300A may control the signal delay operation by adjusting the sequential turn-on timings of the inverters. The signal delay operation can reduce a slope loss of the output signal, compared to the signal delay operation of the delay cell illustrated in FIGS. 2 and 3. Furthermore, since additional inverters for compensating for a slope loss do not need to be used, the delay cell 300A can reduce PVT variations, which may be caused by the use of additional inverters.

Figure 7:
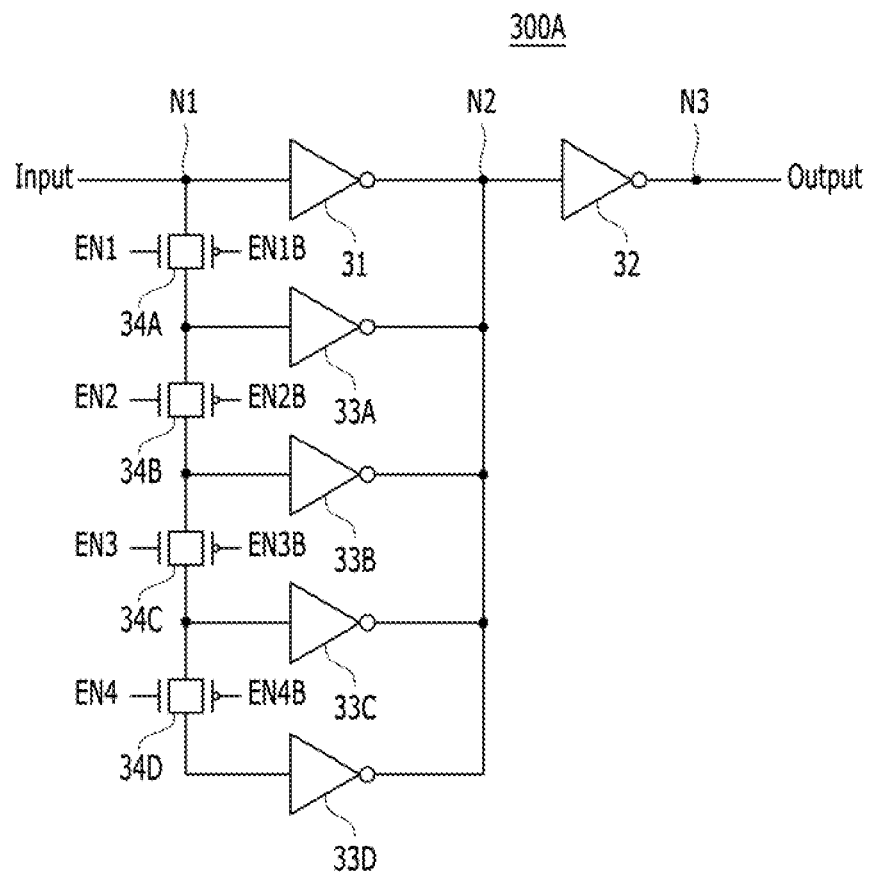
FIG. 7 is a circuit diagram illustrating a configuration of a delay cell in accordance with another embodiment of the present disclosure.

FIG. 7 is a circuit diagram illustrating a configuration of a delay cell 300A in accordance with another embodiment of the present disclosure.

Referring to FIG. 7, the delay cell 300A may delay an input signal applied to an input terminal Input, and output the delayed input signal as an output signal through an output terminal Output. The delay cell 300A may receive an enable signal EN/ENB as the control signal generated by the signal generation circuit 300B of FIG. 4.

The delay cell 300A may include a first inverter 31, a second inverter 32, additional inverters 33A to 33D, and transfer gates 34A to 34D serving as delay elements. The first inverter 31 may be coupled to the input terminal Input through a node N1, and receive an input signal applied through the input terminal Input. The first inverter 31 may delay the received input signal and output the delayed input signal to a node N2, thereby outputting the delayed signal. The additional inverters 33A to 33D may be coupled in parallel to the first inverter 31 through the transfer gates 34A to 34D. That is, the additional inverters 33A to 33D and the first inverter 31 may be coupled between the nodes N1 and N2.

The transfer gates 34A to 34D may receive enable signals EN1 to EN4/EN1B to EN4B generated by the signal generation circuit 300B, and selectively couple the additional inverters 33A to 33D to the input terminal Input in response to the received enable signals. For example, the transfer gate 34A may be turned on in response to the enable signal EN1/EN1B, and couple the additional inverter 33A to the input terminal Input. For another example, the transfer gate 34B may be turned on in response to the enable signal EN2/EN2B and couple the additional inverter 33B to the input terminal Input, the transfer gate 34C may be turned on in response to the enable signal EN3/EN3B and couple the additional inverter 33C to the input terminal Input, and the transfer gate 34D may be turned on in response to the enable signal EN4/EN4B and couple the additional inverter 33D to the input terminal Input.

Depending on a delay value required by the delay cell 300A, the enable signals generated by the signal generation circuit 300B may be changed. For example, when the required delay value is small, the signal generation circuit 300B may generate the enable signals EN1 to EN4/EN1B to EN4B to operate only the inverter 33A close to the first inverter 31. For another example, when the required delay value is large, the signal generation circuit 300B may generate the enable signals EN1 to EN4/EN1B to EN4B to operate all of the inverters 33A to 33D. That is, depending on the required delay value, the inverters 338 to 33D after the inverter 33A close to the first inverter 31 may be controlled to sequentially operate.

When the additional inverter 33A is coupled in parallel to the first inverter 31 by the transfer gate 34A, the additional inverter 33A may be coupled to the input terminal Input through the transfer gate 34A and the node N1. In this case, the additional inverter 33A may receive an input signal applied through the input terminal Input, the node N1, and the transfer gate 34A. The additional inverter 33A may invert the received signal and output the inverted signal to the node N2, thereby outputting the delayed signal.

When the additional inverters 33A and 33B are coupled in parallel to the first inverter 31 by the transfer gates 34A and 34B, the additional inverter 33A may be coupled to the input terminal Input through the transfer gate 34A and the node N1, and the additional inverter 33B may be coupled to the input terminal Input through the transfer gate 34B, the transfer gate 34A, and the node N1. In this case, the additional inverter 33A may receive an input signal applied through the input terminal Input, the node N1, and the transfer gate 34A, and the additional inverter 33B may receive an input signal applied through the input terminal Input, the node N1, the transfer gate 34A, and the transfer gate 34B. The additional inverter 33A may invert the received signal and output the inverted signal to the node N2, thereby outputting the delayed signal. The additional inverter 33B may invert the received signal and output the inverted signal to the node N2, thereby outputting the delayed signal.

When the additional inverters 33A to 33C are coupled in parallel to the first inverter 31 by the transfer gates 34A to 34C, the additional inverter 33A may be coupled to the input terminal Input through the transfer gate 34A, and the node N1, the additional inverter 33B may be coupled to the input terminal Input through the transfer gate 34B, the transfer gate 34A, and the node N1, and the additional inverter 33C may be coupled to the input terminal Input through the transfer gate 34C, the transfer gate 34B, the transfer gate 34A, and the node N1. In this case, the additional inverter 33A may receive an input signal applied through the input terminal Input, the node N1, and the transfer gate 34A, the additional inverter 33B may receive an input signal applied through the input terminal Input, the node N1, the transfer gate 34A, and the transfer gate 34B, and the additional inverter 33C may receive an input signal applied through the input terminal Input, the node N1, the transfer gate 34A, the transfer gate 34B, and the transfer gate 34C. The additional inverter 33A may invert the received signal and output the inverted signal to the node N2, thereby outputting the delayed signal. The additional inverter 33B may invert the received signal and output the inverted signal to the node N2, thereby outputting the delayed signal. The additional inverter 33C may invert the received signal and output the inverted signal to the node N2, thereby outputting the delayed signal.

When the additional inverters 33A to 33D are coupled in parallel to the first inverter 31 by the transfer gates 34A to 34D, the additional inverter 33A may be coupled to the input terminal Input through the transfer gate 34A and the node N1, the additional inverter 33B may be coupled to the input terminal Input through the transfer gate 34B, the transfer gate 34A, and the node N1, the additional inverter 33C may be coupled to the input terminal Input through the transfer gate 34C, the transfer gate 34B, the transfer gate 34A, and the node N1, and the additional inverter 33D may be coupled to the input terminal Input through the transfer gate 34D, the transfer gate 34C, the transfer gate 34B, the transfer gate 34A, and the node N1. In this case, the additional inverter 33A may receive an input signal applied through the input terminal Input, the node N1, and the transfer gate 34A, the additional inverter 33B may receive an input signal applied through the input terminal Input, the node N1, the transfer gate 34A, and the transfer gate 34B, the additional inverter 33C may receive an input signal applied through the input terminal Input, the node N1, the transfer gate 34A, the transfer gate 34B, and the transfer gate 34C, and the additional inverter 33D may receive an input signal applied through the input terminal Input, the node N1, the transfer gate 34A, the transfer gate 34B, the transfer gate 34C, and the transfer gate 34D. The additional inverter 33A may invert the received signal and output the inverted signal to the node N2, thereby outputting the delayed signal. The additional inverter 33B may invert the received signal and output the inverted signal to the node N2, thereby outputting the delayed signal. The additional inverter 33C may invert the received signal and output the inverted signal to the node N2, thereby outputting the delayed signal. The additional inverter 33D may invert the received signal and output the inverted signal to the node N2, thereby outputting the delayed signal. Although inverters 33A to 33D are illustrated for exemplary purpose, additional inverters may be utilized to control delay amounts.

The second inverter 32 may be coupled between the first inverter 31 and the output terminal Output. The second inverter 32 may invert the signal, which is outputted from the first inverter 31 and applied to the node N2, and output the inverted signal through a node N3 and the output terminal Output, thereby outputting the delayed signal. Furthermore, when the additional inverter 33A is coupled in parallel to the first inverter 31, the second inverter 32 may invert the signal, which is outputted from the additional inverter 33A and applied to the node N2, and output the inverted signal through the node N3 and the output terminal Output, thereby outputting the delayed signal. Furthermore, when the additional inverter 33B is coupled in parallel to the first inverter 31, the second inverter 32 may invert the signal, which is outputted from the additional inverter 33B and applied to the node N2, and output the inverted signal through the node N3 and the output terminal Output, thereby outputting the delayed signal. Also, when the additional inverter 33C is coupled in parallel to the first inverter 31, the second inverter 32 may invert the signal which is outputted from the additional inverter 33C and applied to the node N2, and output the inverted signal through the node N3 and the output terminal Output, thereby outputting the delayed signal. Furthermore, when the additional inverter 33D is coupled in parallel to the first inverter 31, the second inverter 32 may invert the signal, which is outputted from the additional inverter 33D and applied to the node N2, and output the inverted signal through the node N3 and the output terminal Output, thereby outputting the delayed signal.

Figure 8:
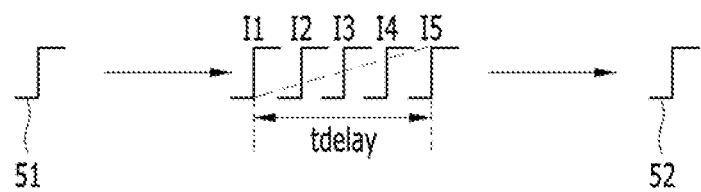
FIG. 8 is a diagram illustrating operation timing between an input signal and an output signal in the delay cell of FIG. 7.

FIG. 8 is a diagram illustrating operation timing between the input signal 51 and the output signal 52 in the delay cell 300A of FIG. 7.

Referring to FIG. 8, the delay cell 300A of FIG. 7 may delay the input signal 51 by a specific time tdelay, and output the delayed input signal as the output signal 52. At this time, the delay cell 300A may output the signal which is inverted by the inverter 31 and then inverted by the inverter 32, or output the signal which is inverted by the inverters 33A to 33D and then inverted by the inverter 32. The signal which is inverted by the inverter 33A to 33D and then inverted by the inverter 32 may be delayed by the specific time tdelay from the signal which is inverted by the inverter 31 and then inverted by the inverter 32. That is, a signal 15 inverted and outputted by the inverter 33D may be delayed by the specific time tdelay from a signal 11 inverted and outputted by the inverter 31. A signal 12 may indicate a signal inverted and outputted by the inverter 33A, a signal 13 may indicate a signal inverted and outputted by the inverter 33B, and a signal 14 may indicate a signal inverted and outputted by the inverter 33C.

The delay cell 300A may control the inverter 31 to perform the signal inversion and output operation, and then control the inverters 33A to 33D to perform the signal inversion and output operation. As such, the delay cell 300A may control the inverter 31 to perform the operation and then control the inverters 33A to 33D to sequentially perform operations, depending on a required delay value. That is, the delay cell 300A may control the signal delay operation by adjusting the sequential turn-on timings of the inverters. The signal delay operation can reduce a slope loss of the output signal, compared to the signal delay operation of the conventional delay cell illustrated in FIGS. 2 and 3. Furthermore, since additional inverters for compensating for a slope loss do not need to be used, the delay cell 300A can reduce PVT variations which may be caused by the use of additional inverters.

In accordance with various exemplary embodiments of the present disclosure, the delay cell can control the signal delay operation by adjusting sequential turn-on timings of the inverters. Such a signal delay operation can reduce a slope loss of the output signal, and remove PVT variations which may be caused by additional inverters which are used to compensate for a slope loss.

Although various exemplary embodiments have been described for illustrative purposes, it will be apparent to those skilled in the art that various changes and modifications may be made without departing from the spirit and scope of the invention as defined in the following claims.

What is claimed is:

1. A delay cell comprising:
a first inverter coupled to an input terminal;
a second inverter coupled between the first inverter and an output terminal;
a plurality of additional inverters coupled in parallel to the first inverter; and
a delay element suitable for selectively coupling the additional inverters to the input terminal under control of a control signal.

2. The delay cell of claim 1, wherein the delay element comprises a switching element, which is switched on under control of the control signal, and couples the additional inverter to the input terminal.

3. The delay cell of claim 2, wherein the switching element comprises a transfer gate, which is turned on under control of the control signal, and couples the additional inverter to the input terminal.

4. The delay cell of claim 1, wherein the plurality of additional inverters operate based on a plurality of enable signals, respectively.

5. A delay circuit comprising:
at least one delay cell suitable for delaying an input signal applied to an input terminal, and outputting the delayed input signal as an output signal through an output terminal; and
a signal generation circuit suitable for generating a control signal for controlling the delay of the input signal,
wherein the delay cell comprises:
a first inverter coupled to the input terminal;
a second inverter coupled between the first inverter and the output terminal;
a plurality of additional inverters coupled in parallel to the first inverter; and
a delay element suitable for selectively coupling one or more of the additional inverters to the input terminal under control of the control signal.

6. The delay circuit of claim 5, wherein the delay element comprises a plurality of switching elements, which couple the corresponding inverters of the additional inverters to the input terminal, based on a plurality of enable signals included in the control signal, respectively.

7. The delay circuit of claim 6, wherein each of the switching elements comprises a transfer gate, which is turned on based on the corresponding enable signal among the plurality of enable signals, and couples the corresponding inverter of the additional inverters to the input terminal.

8. The delay circuit of claim 6, wherein the signal generation circuit generates the plurality of enable signals to operate only a near inverter close to the first inverter, among the plurality of additional inverters, when a required delay value is small.

9. The delay circuit of claim 8, wherein the signal generation circuit generates the plurality of enable signals to sequentially operate the remaining inverters after the near inverter, among the plurality of additional inverters, as the required delay value is increased.

* * * * *